(12) United States Patent
Kayano et al.

(10) Patent No.: US 6,625,427 B1
(45) Date of Patent: Sep. 23, 2003

(54) RADIO TRANSMISSION APPARATUS

(75) Inventors: Hiroyuki Kayano, Yokohama (JP); Yasuo Suzuki, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/383,366

(22) Filed: Aug. 26, 1999

(30) Foreign Application Priority Data

Aug. 26, 1998 (JP) .......................................... 10-240731

(51) Int. Cl.[7] .......................... H03C 1/62; H04B 17/00
(52) U.S. Cl. ........................ 455/115; 455/103; 455/104
(58) Field of Search ................................ 455/103–104, 455/115, 117, 562, 561, 90; 505/210

(56) References Cited

U.S. PATENT DOCUMENTS

| | | | | |
|---|---|---|---|---|
| 4,658,206 A | * | 4/1987 | Yamanaka | 324/51 |
| 5,081,713 A | * | 1/1992 | Miyazaki | 455/76 |
| 5,136,267 A | * | 8/1992 | Cabot | 333/174 |
| 5,472,935 A | * | 12/1995 | Yandrofski et al. | 505/210 |
| 5,548,825 A | * | 8/1996 | Maemura et al. | 455/115 |
| 5,604,925 A | * | 2/1997 | O'Malley et al. | 455/254 |
| 5,616,538 A | * | 4/1997 | Hey-Shipton et al. | 505/210 |
| 5,843,139 A | * | 12/1998 | Goedeke et al. | 607/32 |

OTHER PUBLICATIONS

U.S. patent application Ser. No. 08/653,270, filed May 24, 1996.

* cited by examiner

Primary Examiner—Lee Nguyen
Assistant Examiner—Tuan Tran
(74) Attorney, Agent, or Firm—Oblon, Spivak, McClelland, Maier & Neustadt, P.C.

(57) ABSTRACT

A radio transmission apparatus for performing radio transmission by use of a plurality of carrier frequencies including signal processing systems for respective channels. Each signal processing system includes a transmission signal generator that modulates transmission data with a predetermined carrier frequency signal to generate a transmission signal, an amplifier that amplifies the transmission signal, and a variable band-pass filter connected to the output of the amplifier. The outputs of the signal processing systems are combined into a radio transmission signal. At least center frequency of a pass band of the variable band-pass filter can be changed, with the pass band determined based on the carrier frequency signal of the channel. The apparatus also includes a fault detector configured to detect a fault of each variable band-pass filter.

9 Claims, 9 Drawing Sheets

RADIO TRANSMISSION APPARATUS

This Application claims the benefit of the earlier filing date of Japanese Patent No. 10-240731, filed Aug. 26, 1998, the entire contents of which are hereby incorporated herein by reference.

BACKGROUND OF THE INVENTION

The present invention relates to a multicarrier type radio transmission apparatus for combining signals of a plurality of channels with a plurality of carrier frequencies into one signal to effect radio transmission.

This application is based on Japanese Patent Application No. 10-240731, filed Aug. 26, 1998, the content of which is incorporated herein by reference.

Figure 1:
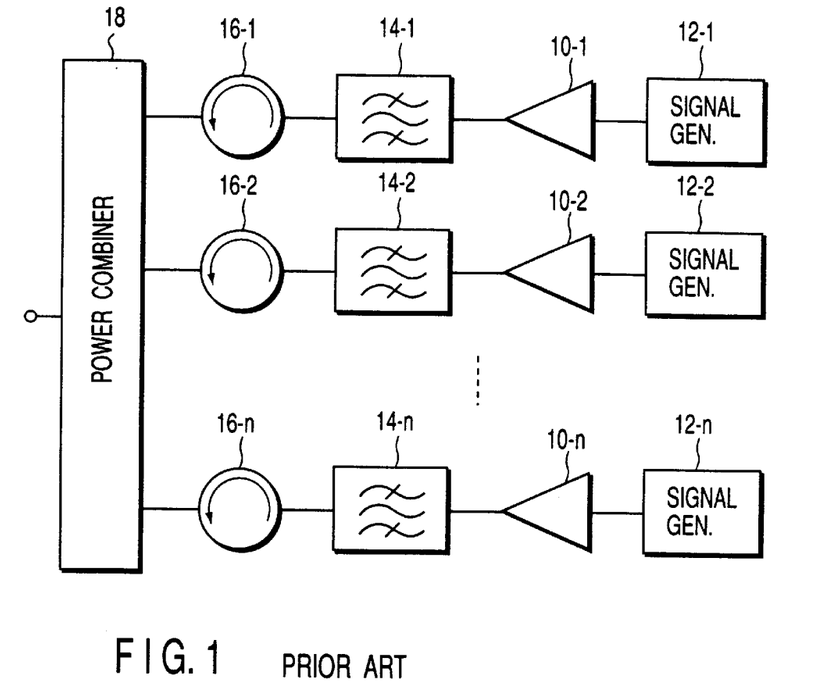
FIG. 1 is a block diagram showing a conventional multicarrier radio transmission apparatus of individual amplification system.

The individual amplification system was first put into practice as the amplification system in the multicarrier radio transmission apparatus. In the radio transmission apparatus of individual amplification system, amplifiers 10-1, 10-2, ..., 10-n of a number equal to the number of carrier frequencies (the number of channels) used are provided as shown in FIG. 1 and transmission signals of the respective channels (signals from signal generators 12-1, 12-2, ..., 12-n) are amplified by the respective amplifiers 10-1, 10-2, ..., 10-n. Since the signals input to the respective amplifiers 10-1, 10-2, ..., 10-n are signals each corresponding to one of the channels, there occurs no possibility that the signal of each channel will interfere with the signal of another channel. Thus, the amplifiers 10-1, 10-2, ..., 10-n can be operated in a high-efficiency operating region. Further, it is advantageous in the heat radiation because the amplifiers 10-1, 10-2, ..., 10-n are separately provided for n channels.

Output signals of the amplifiers 10-1, 10-2, ..., 10-n are combined in power by a power combiner 18 and supplied to an antenna (not shown). In order to prevent signals reflected from the power combiner 18 from being fed back to the amplifiers 10-1, 10-2, ..., 10-n and causing distortion in the amplified signals, it is necessary to insert isolators 16-1, 16-2, ..., 16-n between the amplifiers 10-1, 10-2, ..., 10-n and the power combiner 18 so as to maintain isolation between the channels. However, if the isolators 16-1, 16-2, ..., 16-n are inserted, there occurs a problem that great loss occurs to produce a large amount of heat.

Further, in order to simplify the construction of the power combiner 18, it is necessary to supply the amplified signals to the power combiner 18 via band-pass filters 14-1, 14-2, ..., 14-n having high channel selectivity. However, since the pass bands are fixed in the conventional filters, it is impossible to change the frequency of the carrier signal of each channel if the pass bands of the filters 14-1, 14-2, ..., 14-n are set to correspond to the bands of signals of the respective channels output from the signal generators 12-1, 12-2, ..., 12-n. In the actual transmission system, there is a request for changing the carrier frequency of each channel to a carrier frequency of another channel assigned to the system or there will be a request for changing the bandwidth of the carrier frequency in the future, but the individual amplification system cannot cope with the request. In order to cope with the request at least to some extent, the pass bands of the filters 14-1, 14-2, ..., 14-n are set equal to each other and the carrier frequency band of all of the channels is set as the pass band. However, in this case, it is also necessary to insert the isolators in order to improve the channel selectivity. Therefore, the power combiner 18 becomes complicated in construction.

Figure 2:
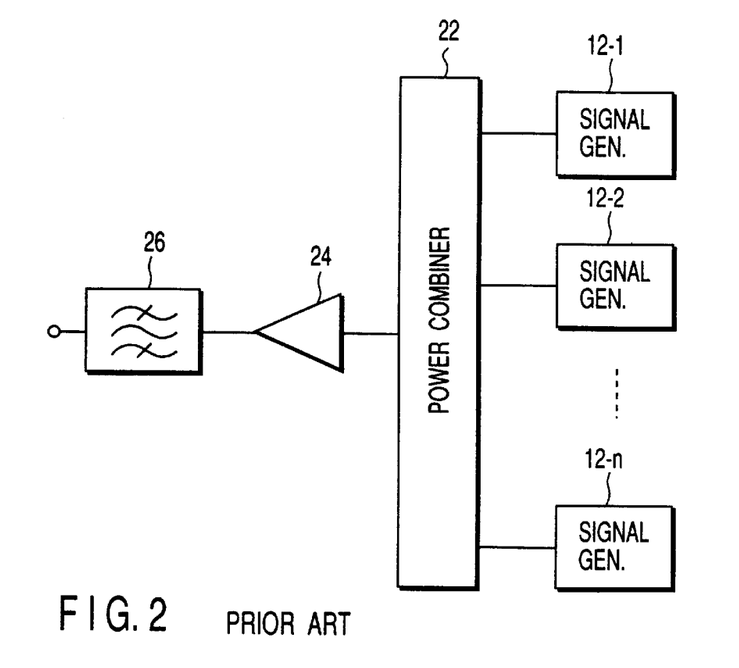
FIG. 2 is a block diagram showing a conventional multicarrier radio transmission apparatus of collective amplification system.

In order to solve the problem of the individual amplification system, a collective amplification system was developed. As shown in FIG. 2, in the collective amplification system, signals of carrier frequencies of the respective channels output from the transmission signal generators 12-1, 12-2, ..., 12-n are first combined by a power combiner 22 and then collectively amplified by an amplifier 24. Thus, since the amplifier 24 is not provided in the succeeding stage of the amplifier 24, it becomes unnecessary to connect an isolator in the preceding stage of the power combiner 22 and a problem of loss and heat generation which occurs in the individual amplification system by the presence of the isolators will not occur. However, since a plurality of channel signals are simultaneously input to the amplifier 24, the linearity of the amplifier 24 becomes important in order to prevent inter-modulation distortion between the channel signals (generally, the high linearity operation and the high-efficiency operation conflict with each other), but in recent years, the high-efficiency operation of a linear amplifier can be attained by various technical improvements. In this respect, the advantage in efficiency of the collective amplification system is recognized.

However, in the collective amplification system, the operation efficiency of approx. 40% at maximum can be attained when the maximum permissible number of channels are received, but if there is an unused channel, the efficiency is lowered. This is because the amplifier 24 must be operated in a low-efficiency operating region (low input power portion) when the number of channels used is small since the input power to the amplifier 24 is changed according to the number of channels used. Further, in the collective amplification system, since heat generation is concentrated in one portion of the amplifier 24, it becomes necessary to take a large-scale heat radiation measure. Since the number of accommodated channels is determined by the maximum permissible number of channels of the amplifier 24 and the value of the maximum permissible power of the filter 26, there occurs a problem that it is difficult to increase the number of accommodated channels after designing of the system. Further, there occurs a problem that large permissible power becomes necessary as the specification of the filter 26 in order to deal with a large number of channels.

BRIEF SUMMARY OF THE INVENTION

Accordingly, it is an object of the present invention to solve a problem of a conventional multicarrier radio transmission apparatus of individual amplification system.

Another object of the present invention is to provide a radio transmission apparatus which can prevent inter-modulation distortion between channels in the amplifier and reduce the adjacent channel leakage power to attain the high-efficiency operation of the amplifier higher than the efficiency of the conventional individual amplification system.

Still another object of the present invention is to provide a radio transmission apparatus which is excellent in heat radiation and can attain the high-efficiency operation irrespective of the utilization factor of the channels.

Another object of the present invention is to provide a radio transmission apparatus which is highly flexible with respect to an increase or decrease in the number of accommodated channels.

Another object of the present invention is to provide a radio transmission apparatus which can cope with a difference in the transmission rate with high flexibility.

A radio transmission apparatus according to the present invention performs radio transmission by use of a plurality of carrier frequencies and comprises signal processing systems each including a transmission signal generator for generating a signal of one carrier frequency, an amplifier for amplifying the signal generated from the transmission signal generator, and a variable band-pass filter for permitting only the signal of the one carrier frequency among the output signal of the amplifier to pass therethrough; and a combiner for combining signals output from the variable band-pass filters of the plurality of signal processing systems into one signal and using the signal as a transmission signal.

In the above radio transmission apparatus, since a signal generated from the transmission signal generator and passing through the amplifier and variable band-pass filter which constitute one signal processing system is a signal of one carrier frequency, inter-modulation distortion between the signals of respective carrier frequencies will not occur in the amplifier. Further, since only the signal of one carrier frequency is permitted to pass through the filter, the adjacent channel leakage power is suppressed so as to make it difficult to generate inter-modulation distortion of the signal between the channels. Therefore, the individual amplifiers can be operated with an efficiency higher than that of the conventional individual amplification system. Generally, the amplifier having no inter-modulation distortion is operated with a lowest efficiency. In the conventional individual amplification system, the amplifier can be operated with an efficiency higher than that of the amplifier having no inter-modulation distortion since it is required for the amplifier that the adjacent channel leakage power is limited to be lower than a predetermined level. According to the present invention, since the leakage power is suppressed by the filter, it is not required for the amplifier that the adjacent channel leakage power is limited to be lower than the predetermined level. As a result, the amplifier can be operated with an efficiency higher than that of the conventional individual amplification system. Further, since the amplifiers are separately disposed for the respective channels, the heat radiation characteristic is improved so as to make it unnecessary to provide a large-scale heat radiation structure. Since the filter can be constituted by a filter having a resistance to withstand the power of a signal of one channel, a superconductive filter, for example, can be used as the filter of the radio transmission apparatus.

The transmission signal generators of the plurality of signal processing systems have carrier frequencies different for the respective signal processing systems.

Therefore, interference due to inter-modulation of the signal of another carrier frequency can be prevented and it becomes possible to easily combine the powers of the signals of the respective channels by use of the combiner, thereby making it possible to save the power of the radio transmission apparatus.

Further, the center frequency of the variable band-pass filter can be made variable with the bandwidth of the pass band thereof kept constant or both of the center frequency and the bandwidth of the pass band can be made variable.

Therefore, it becomes possible to cope with data transmission from data transmission with relatively low rate as in the case of voice to high rate data transmission as in the case of moving picture by determining the bandwidth of the pass band of each variable band-pass filter according to the signal transmission rate.

Further, if a superconductive filter is used as the variable band-pass filter, a refrigerator for cooling the superconductive filters, power monitoring means for monitoring powers of the signal outputs from the amplifiers, temperature monitoring means for monitoring the temperatures of the superconductive filters, and control means for variably controlling the operation efficiency of the refrigerator based on the power monitoring result obtained by the power monitoring means and the filter temperature obtained by the temperature monitoring means are provided.

Thus, the refrigerator can be efficiently operated and power saving can be attained.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE INVENTION

A preferred embodiment of a multicarrier radio transmission apparatus according to the present invention will now be described with reference to the accompanying drawings.

First Embodiment

Figure 3:
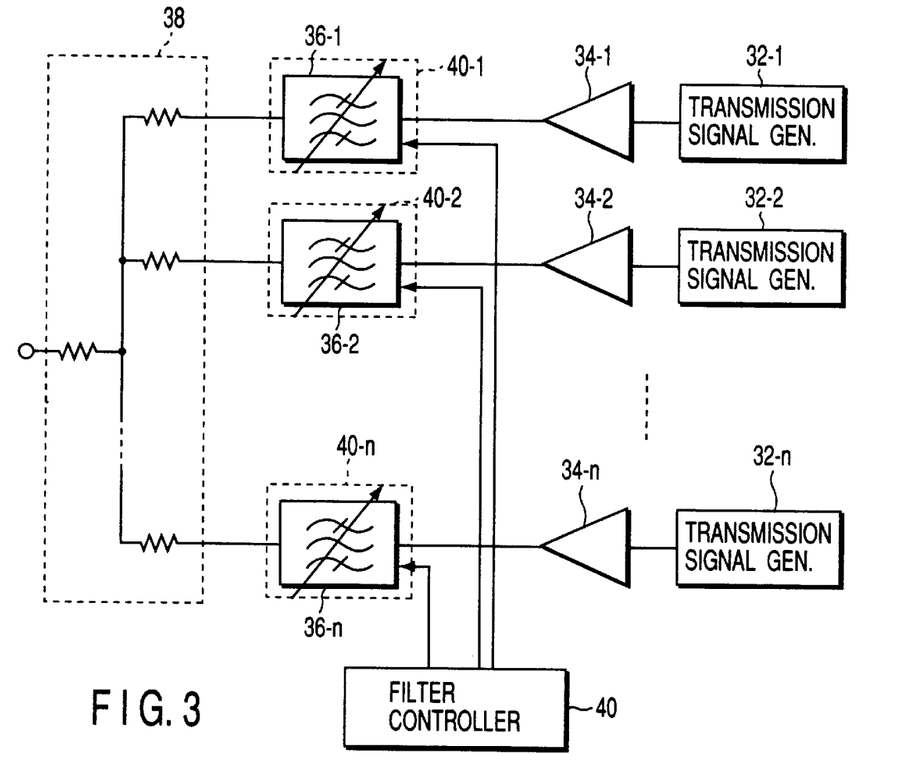
FIG. 3 is a block diagram of a first embodiment of a multicarrier radio transmission apparatus according to the present invention.

FIG. 3 is a block diagram showing the construction of the first embodiment. The first embodiment is constructed by transmission signal generators 32-1, 32-2, . . . , 32-n, amplifiers 34-1, 34-2, . . . , 34-n, filters 36-1, 36-2, . . . , 36-n, power combiner 38, and filter controller 40.

Figure 4:
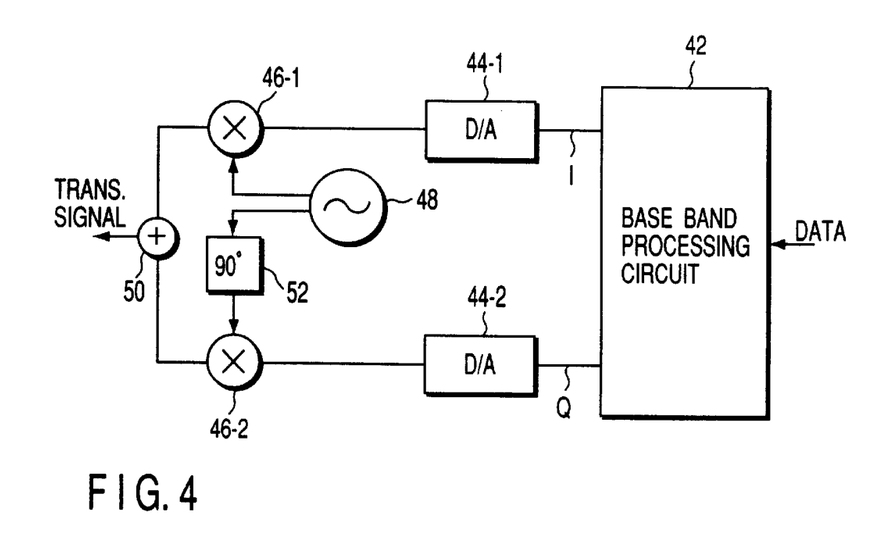
FIG. 4 is a block diagram of a transmission signal generator of the first embodiment.

Each of the transmission signal generators 32-1, 32-2, . . . , 32-n generates a transmission signal of one carrier frequency. For example, as shown in FIG. 4, each of the transmission signal generators 32-1, 32-2, . . . , 32-n includes a baseband signal processing circuit 42 for converting a digital data signal to be transmitted to modulation signals I and Q, D/A converters 44-1 and 44-2 for converting the digital modulation signals to analog modulation signals, and a frequency converter for converting the analog modulation signals to a signal of a carrier frequency band for radio transmission. The frequency converter includes a local oscillator 48, a mixer 46-1 for mixing the output of the D/A converter 44-1 with the output of the local oscillator 48, a mixer 46-2 for mixing the output of the D/A converter 44-2 with the output of the local oscillator 48 supplied via a 90° phase shifter 52, and an adder 50 for adding together the outputs of the mixers 46-1 and 46-2. The oscillation frequencies of the local oscillators 48 are different for the respective transmission signal generators 32-1, 32-2, . . . , 32-n.

The amplifiers 34-1, 34-2, . . . , 34-n amplify signals of different carrier frequencies generated from the transmission signal generators 32-1, 32-2, . . . , 32-n to corresponding transmission power levels and then output the amplified signals to the filters 36-1, 36-2, . . . , 36-n.

Each of the filters 36-1, 36-2, . . . , 36-n is a variable band-pass filter and has a function of shifting the center frequency of the pass band (of the fixed bandwidth) having a constant bandwidth according to a control signal from the filter controller 40. The filter controller 40 selects the center frequency of the pass band of each of the filters 36-1, 36-2, . . . , 36-n according to the control signal so as to permit only a signal of one desired carrier frequency among the plurality of carrier frequencies which can be used for transmission (that is, one of the output signals of transmission signal generators 32-1, 32-2, . . . , 32-n) to pass through a corresponding one of the filters 36-1, 36-2, . . . , 36-n.

As the filters 36-1, 36-2, . . . , 36-n which will be described later, a superconductive filter is used. Therefore, the filters 36-1, 36-2, . . . , 36-n are contained in refrigerators 40-1, 40-2, . . . , 40-n. Since the refrigerator is expensive, one refrigerator may be provided for containing all of the filters instead of using the refrigerators for the respective filters, but in order to suppress an influence due to the fault of the refrigerator, it is preferable to provide a plurality of refrigerators so as to containing two or more filters into one refrigerator although it is not absolutely required to provide the refrigerator for each filter. With this construction, even if part of the refrigerators becomes defective, the defective portion eliminating operation can be effected without interrupting the whole operation of the radio transmission apparatus.

A series of devices (signal processing systems) constituted by the transmission signal generators 32-1, 32-2, . . . , 32-n, amplifiers 34-1, 34-2, . . . , 34-n and filters 36-1, 36-2, . . . , 36-n are provided by a number corresponding to the number of carrier frequencies which can be used in the radio transmission apparatus and connected to the power combiner 38 in parallel. Signals passing through the filters 36-1, 36-2, . . . , 36-n are combined in power by the power combiner 38 to make one transmission signal which is in turn transmitted via an antenna (not shown).

Figure 5A:
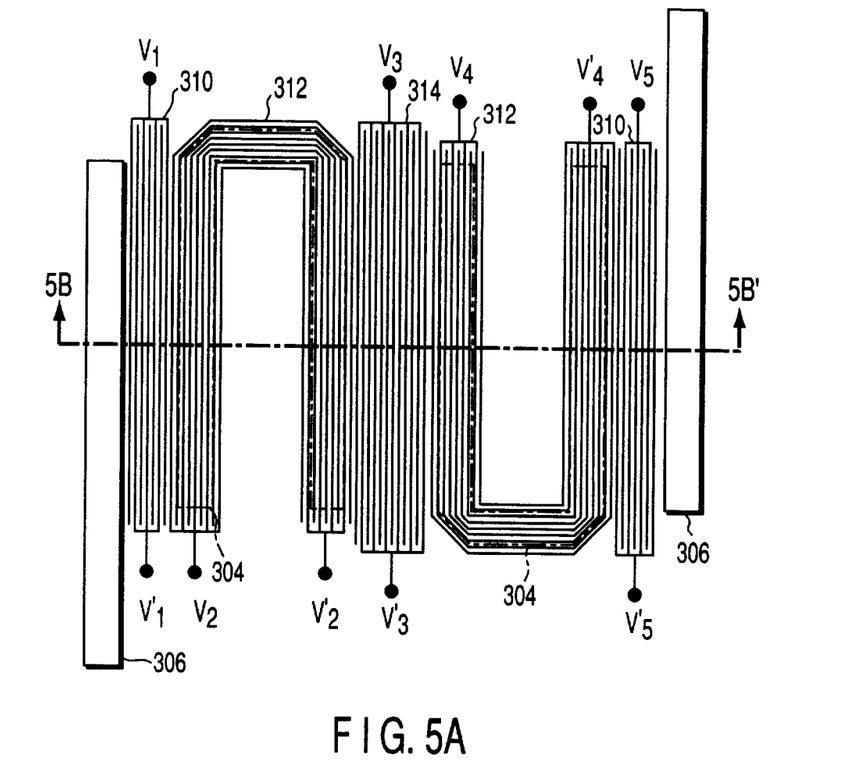
FIGS. 5A and 5B are a plan view and cross sectional view showing one example of a variable band-pass filter of the first embodiment.
Figure 5B:
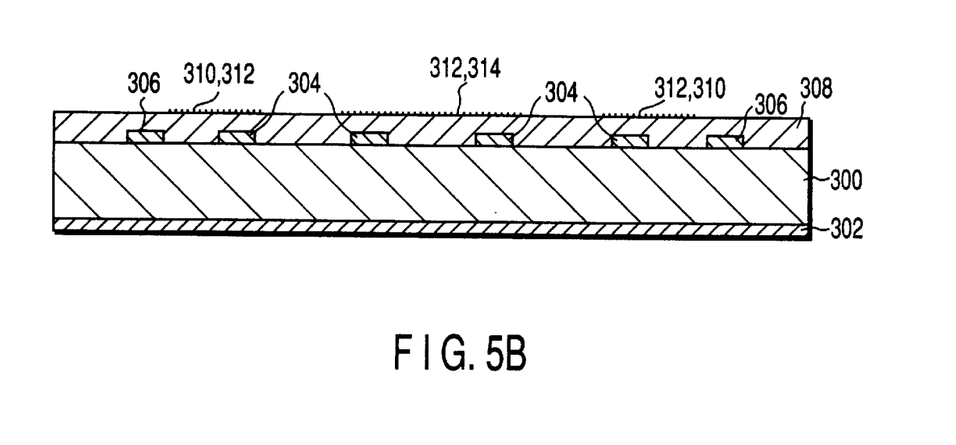

An example of the construction of the filters 36-1, 36-2, . . . , 36-n is explained below. FIGS. 5A and 5B are a plan view and cross sectional view showing one example of a superconductive filter. The filter is a two-stage frequency variable filter as shown in the equivalent circuit diagram of FIG. 6. A superconductive ground conductor layer 302 is formed on one surface of a dielectric substrate 300 and superconductive signal conductor layers 304 and 306 are formed on the other surface thereof so as to constitute a microstrip line structure. A ferroelectric layer 308 (whose dielectric constant is variable) is formed on the signal conductor layers 304 and 306 of the microstrip line structure. Interdigital electrodes 310, 312, and 314 for applying a voltage to the ferroelectric layer 308 are formed on the resonator. The signal conductor layer 304, ferroelectric layer 308, and electrodes 310, 312, and 314 constitute a resonator. The interdigital electrodes 310 are each disposed between the resonator 304 and an input/output line 306, the interdigital electrodes 312 are each disposed on the resonator 304, and the interdigital electrode 314 is disposed between the resonators 304.

Figure 6:
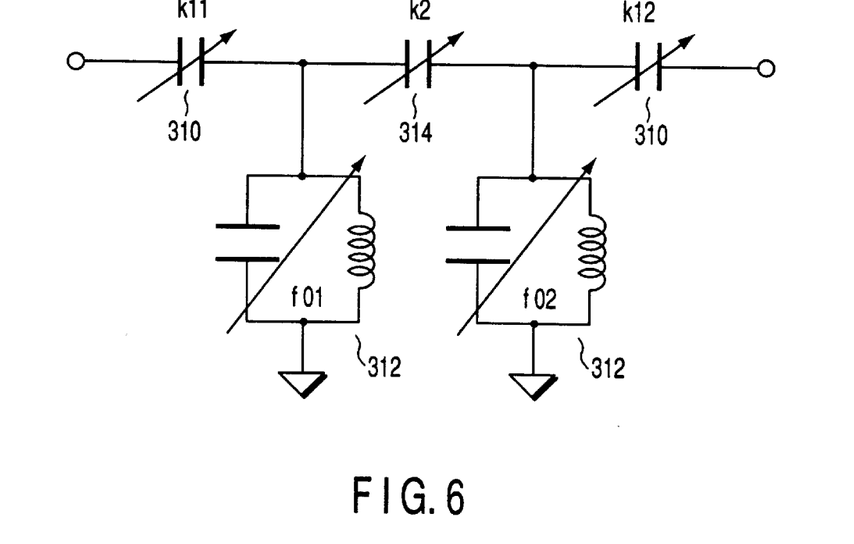
FIG. 6 is an equivalent circuit diagram of the filter shown in FIGS. 5A and 5B.

The equivalent circuit of the filter is shown in FIG. 6. The dielectric constant of the ferroelectric layer 308 is varied by changing the voltages V1, V1'; V5, V5' applied to the interdigital electrodes 310, and as a result, the coupling factors k11, k12 for the input/output can be changed and the external Q can be adjusted. Further, the dielectric constant of the ferroelectric layer 308 is varied by changing the voltages V2, V2'; V2, V2' applied to the interdigital electrodes 312, and as a result, the resonance frequencies f01, f02 can be changed. Also, the dielectric constant of the ferroelectric layer 308 is varied by changing the voltages V3, V3' applied to the interdigital electrode 314, and as a result, the coupling factors k2 between the resonators 304 can be changed. Thus, by combining the voltage adjusting operations, it is possible to realize a superconductive filter in which the center frequency and bandwidth can be varied and high Q and high channel selectivity can be attained.

Figure 7A:
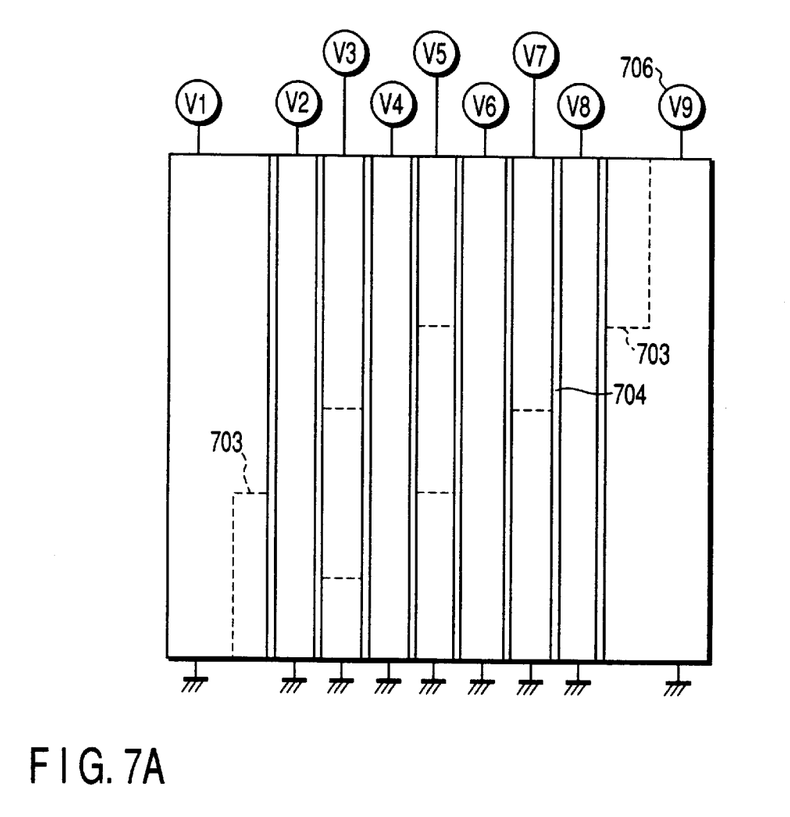
FIGS. 7A and 7B are a plan view and cross sectional view showing a second example of the variable band-pass filter of the first embodiment.
Figure 7B:
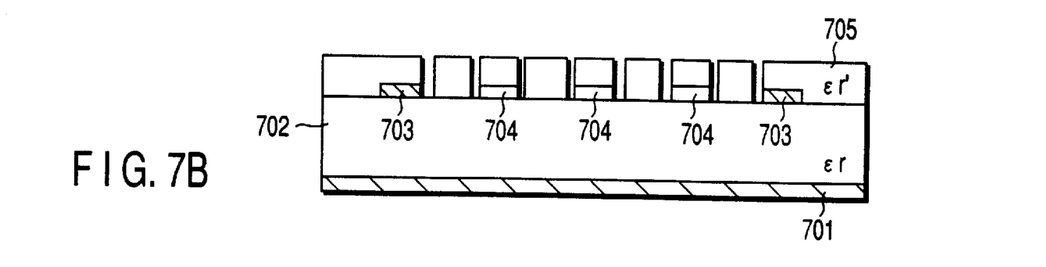

As another example of the variable band-pass filter, a filter disclosed in U.S. Ser. No. 08/653,270 (notice of allowance was issued on Apr. 26, 1999) can also be used. The content of U.S. Ser. No. 08/653,270 is incorporated herein by reference. FIGS. 7A and 7B show a first example thereof. The microstrip structure is constructed by forming input/output lines 703 and a plurality of resonance elements 704 on the front surface of a dielectric substrate 702 having a ground layer 701 formed on the rear surface thereof. Dielectric layers 705 whose relative permittivity ε' is changed by application of voltage are formed on the dielectric substrate 702 to construct a multi-stage filter.

In order to adjust the filter characteristic and resonance frequency of each resonance element in the high-frequency device with the above structure, it is necessary to adjust the coupling factor between the resonance elements and the coupling amount of the external Q as well as the resonance element length. When an attempt is made to adjust all of the adjustment portions and if the number of stages of the filter (the number of resonance elements 704) is set to n, it is necessary to make adjustments on (2n+1) portions.

Therefore, the dielectric layers 705 are respectively formed on the stages of the filter and the effective resonance length, the coupling factor between the resonance elements and the coupling amount of the external Q are changed by application of a DC voltage from a variable voltage source 706 to the dielectric layers 705 via voltage application electrodes (not shown) formed on the end portions of the dielectric layers 705. With this structure, the resonance frequency and filter characteristic can be easily adjusted to desired characteristics.

Figure 8A:
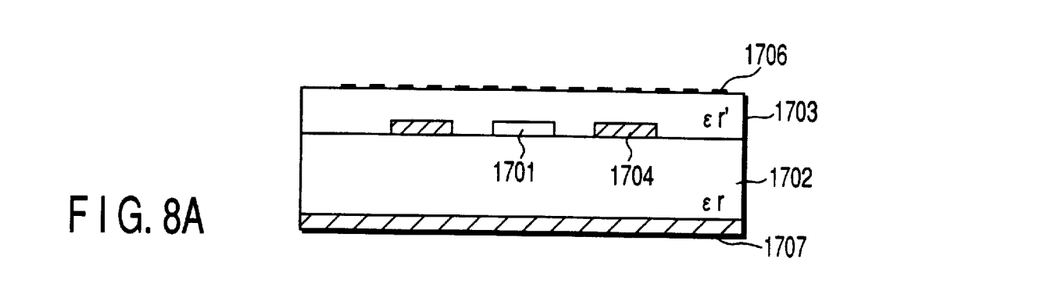
FIGS. 8A and 8B are a plan view and cross sectional view showing a third example of the variable band-pass filter of the first embodiment.
Figure 8B:
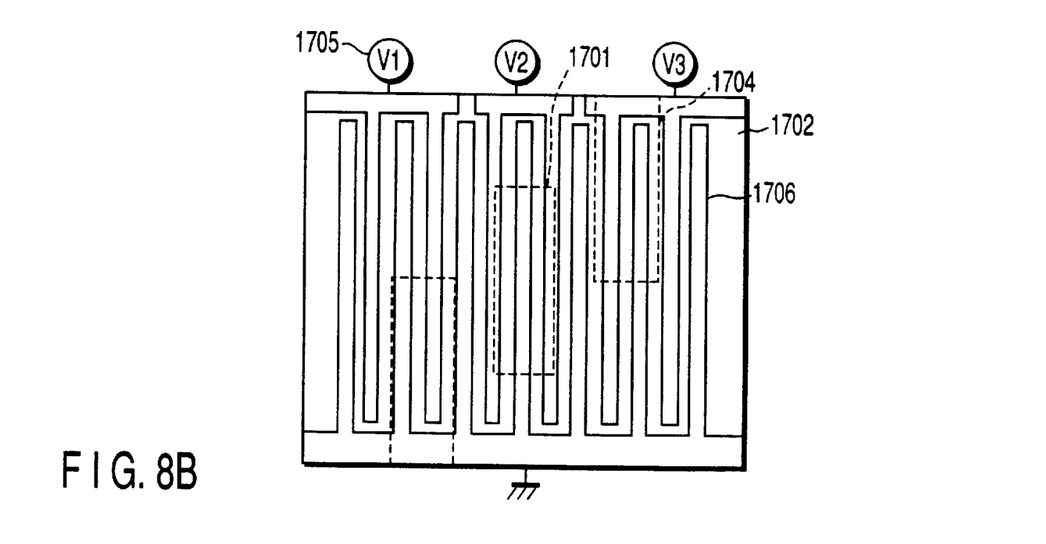

FIGS. 8A and 8B show a second example of the variable band-pass filter. The high-frequency device of microstrip line structure constructed by a resonance element 1701 and this input/output lines 1704 formed on the front surface of a dielectric substrate 1702 having a ground layer 1707 formed on the rear surface thereof is provided. A dielectric layer 1703 whose permittivity is changed by application of voltage is formed on the resonance element 1701. Voltage application interdigital electrodes 1706 having a thickness equal to or less than the skin depth δ expressed by the following equation are formed on the dielectric layer 1703.

$$\delta = \sqrt{\frac{1}{\pi f \mu \sigma}}$$

where f denotes the frequency of the input signal of the filter, $\mu$ denotes the magnetic permeability, $\sigma$ denotes the electric conductivity of the electrode.

Further, a plurality of variable voltage sources 1705 are connected to the voltage application electrodes 1706 so as to make it possible to change the permittivity of the dielectric layer 1703 in plural positions.

Figure 9:
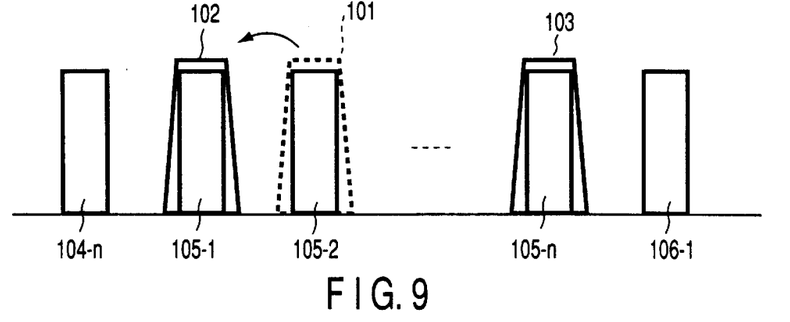
FIG. 9 is a diagram showing the operation for varying the pass band of the filter of the first embodiment.

In a radio transmission system such as a portable telephone, the number of carrier frequencies which can be used in each base station is varied according to the number of calls generated in a cell covered by the base station. Therefore, the filter controller 40 changes the center frequencies of the pass bands of the filters 36-1, 36-2, . . . , 36-n as required when the number of carrier frequencies used by the base station is varied. FIG. 9 shows an example of the pass band shifting of the filters 36-1, 36-2, . . . , 36-n and a state in which the pass band of a filter is shifted from a band 101 to a band 102 (the center frequency is changed) is shown. A band 103 indicates the pass band of another filter, bands 105-1 to 105-n indicate channels assigned to the radio transmission apparatus and bands 104-1 to 104-n; 106-1 to 106-n indicate channels assigned to other radio transmission apparatuses.

As described above, according to the present invention, since signals generated from the transmission signal generators 32-1, 32-2, . . . , 32-n and passing through amplifiers 34-1, 34-2, . . . , 34-n and filters 36-1, 36-2, . . . , 36-n which constitute signal processing systems are of respective carrier frequencies, it becomes unnecessary to connect isolators between the filters 36-1, 36-2, . . . , 36-n and the power combiner 38 unlike the conventional individual amplification system and a problem of the conventional individual amplification system that great loss occurs to produce a large amount of heat can be solved. Further, since the channel selectivity of the filter is high, the power combiner 38 can be made simple in construction.

Thus, the present embodiment relates to the individual amplification system and a problem of the collective amplification system can also be solved. That is, since signals of a plurality of carrier frequencies are simultaneously input to one amplifier in the collective amplification system, inter-modulation distortion occurs between the signals of the carrier frequencies due to the non-linearity of the amplifier and the power of a distorted signal generated by the inter-modulation distortion interferes with and gives a bad influence on a signal of another carrier frequency. On the other hand, according to the present embodiment, since a signal input to each of the amplifiers 34-1, 34-2, . . . , 34-n is only a signal of one carrier frequency, inter-modulation distortion between the signals of the respective carrier frequencies will not occur.

Further, in the present embodiment, interference due to inter-modulation of the signal of another carrier frequency can be prevented by setting the pass bands of the filters 36-1, 36-2, . . . , 36-n of the respective systems to bands for different carrier frequencies. Therefore, it becomes possible to easily combine the signals in power of the respective channels by the combiner 38.

Figure 10:
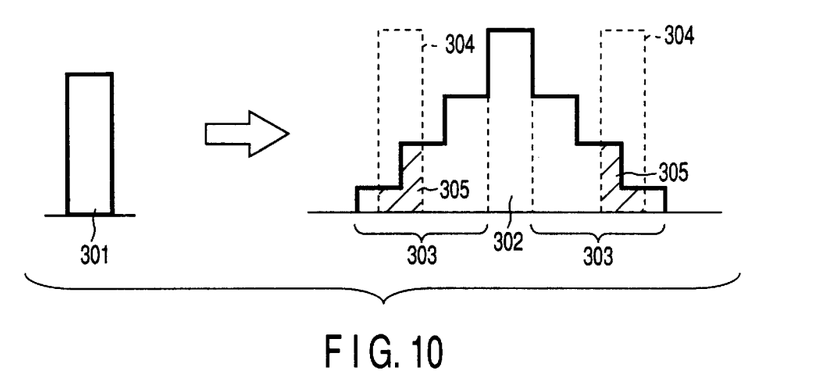
FIG. 10 is a diagram for illustrating a reduction in the efficiency of the amplifier due to the modulation distortion.

Generally, it is understood that, in the amplifier, modulation distortions 303 appear on both sides of an original signal 302 when a modulation signal 301 is amplified as shown in FIG. 10 and power leaks into the adjacent channel to cause interference with the signal 304 of the adjacent channel. On the specification, the upper limit of the adjacent channel leakage power 305 is determined. For example, in a modulation system in which a signal component is contained in an amplitude component such as QPSK, the amplifier is backed off and operated with low efficiency in order to securely attain the linearity of the power amplifier. On the other hand, in the present embodiment, since only a signal of one carrier frequency is permitted to pass through one of the filters 36-1, 36-2, . . . , 36-n, the adjacent channel leakage power is suppressed and it becomes difficult for inter-modulation distortion of the signal between the channels to occur. Therefore, the amplifiers 34-1, 34-2, . . . , 34-n can be operated with high efficiency. Generally, the ratio of the power consumption of the amplifier to the whole power consumption of the radio transmission apparatus is extremely large, and therefore, the high efficiency of the amplifier greatly contributes to power saving of the radio transmission apparatus.

Figure 11:
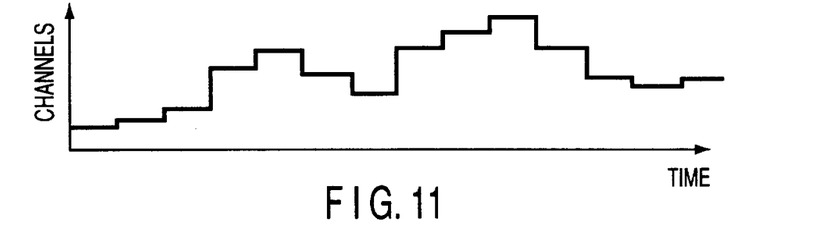
FIG. 11 is a diagram for illustrating a service condition of the channel.

Further, as shown in FIG. 11, for example, it is rare to use all of the channels in the whole time in each base station and only one channel may be used in some time zone. At this time, if even one channel is used in the collective amplification system, approximately the same power as that when all of the channels are used becomes necessary and the power efficiency is further lowered. In the present embodiment, the power supplies of those of the amplifiers 34-1, 34-2, . . . , 34-n which are not used are turned OFF and the power is supplied only to the channel used. As a result, more effective power saving can be attained. More specifically, although not shown in the drawing, an amplifier controller which is similar to the filter controller is provided to turn ON/OFF the power supplies of the amplifiers 34-1, 34-2, . . . , 34-n according to the number of transmission channels.

Further, the heat source is concentrated on one amplifier in the collective amplification system and the heat radiation measure for the heat radiation is an important subject, but in the present embodiment, the whole heat source is dispersed into a plurality of small heat sources by separately disposing the amplifiers 34-1, 34-2, . . . , 34-n for the respective channels and thus the heat radiation property can be improved, thereby making it unnecessary to provide a large-scale heat radiation structure.

Further, in the collective amplification system, since the signal of each channel is amplified after power synthesis, it is required for, for example, the filter connected to the succeeding stage of the amplifier to have high power resistance. The filter is constructed by a resonator and the resonator has a function of concentrating power at the resonance frequency. Therefore, if the filter is constructed by a superconductive material, it is operated only at the power level kept within the critical power density of the superconductor. That is, if a superconductive filter is used in the collective amplification system, the superconductive filter is required to have a high power withstand characteristic and it is difficult to realize a superconductive filter having such a high withstand power characteristic in practice. On the other hand, in the present embodiment, since a filter having a resistance to withstand the power of a signal of one channel can be used, the low loss characteristic can be maintained even when a superconductive filter is used.

Other embodiments of the multicarrier radio transmission apparatus according to the present invention will be described. The same portions as those of the first embodiment will be indicated in the same reference numerals and their detailed description will be omitted.

Second Embodiment

Figure 12:
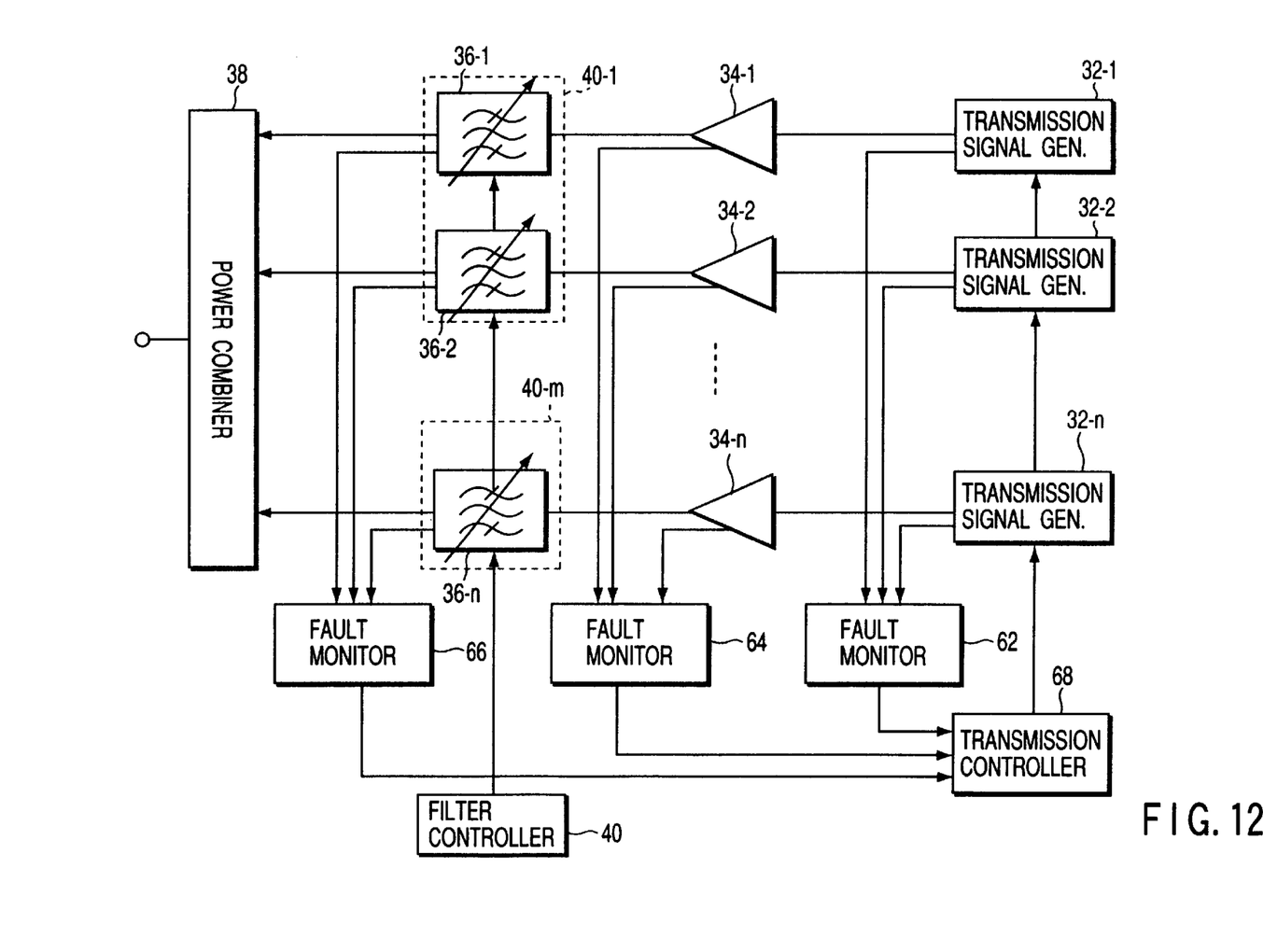
FIG. 12 is a block diagram of a second embodiment of a multicarrier radio transmission apparatus according to the present invention.

FIG. 12 shows a circuit construction for detecting a fault of signal processing systems of respective channels and interrupting the operation of the signal processing system of the channel when a fault is detected. For this purpose, a fault detector 62 is connected to the transmission signal generators 32-1, 32-2, . . . , 32-n, a fault detector 64 is connected to the amplifiers 34-1, 34-2, . . . , 34-n, and a fault detector 66 is connected to the filters 36-1, 36-2, . . . , 36-n. Outputs of the fault detectors 62, 64, 66 are supplied to a transmission controller 68 and generation of the transmission signal of the channel having a fault is interrupted. Although not shown in the drawing, the power supply of the amplifier of the channel having a fault may be turned OFF according to the outputs of the fault detectors 62, 64, 66. In this embodiment, two filters are contained in one refrigerator.

Thus, since this embodiment is an individual amplification system, the control operation is effected to interrupt the operation of the system of a channel including a device having a fault and continuously effect the operation by use of only the systems of the remaining correct channels. In the collective amplification system, the whole system is set into a non-usable state when the amplifier becomes defective, for example, but in this embodiment, since the operation of the systems of the correct channels can be kept effecting until the fault is eliminated, a radio transmission apparatus with high reliability can be realized.

Third Embodiment

Figure 13:
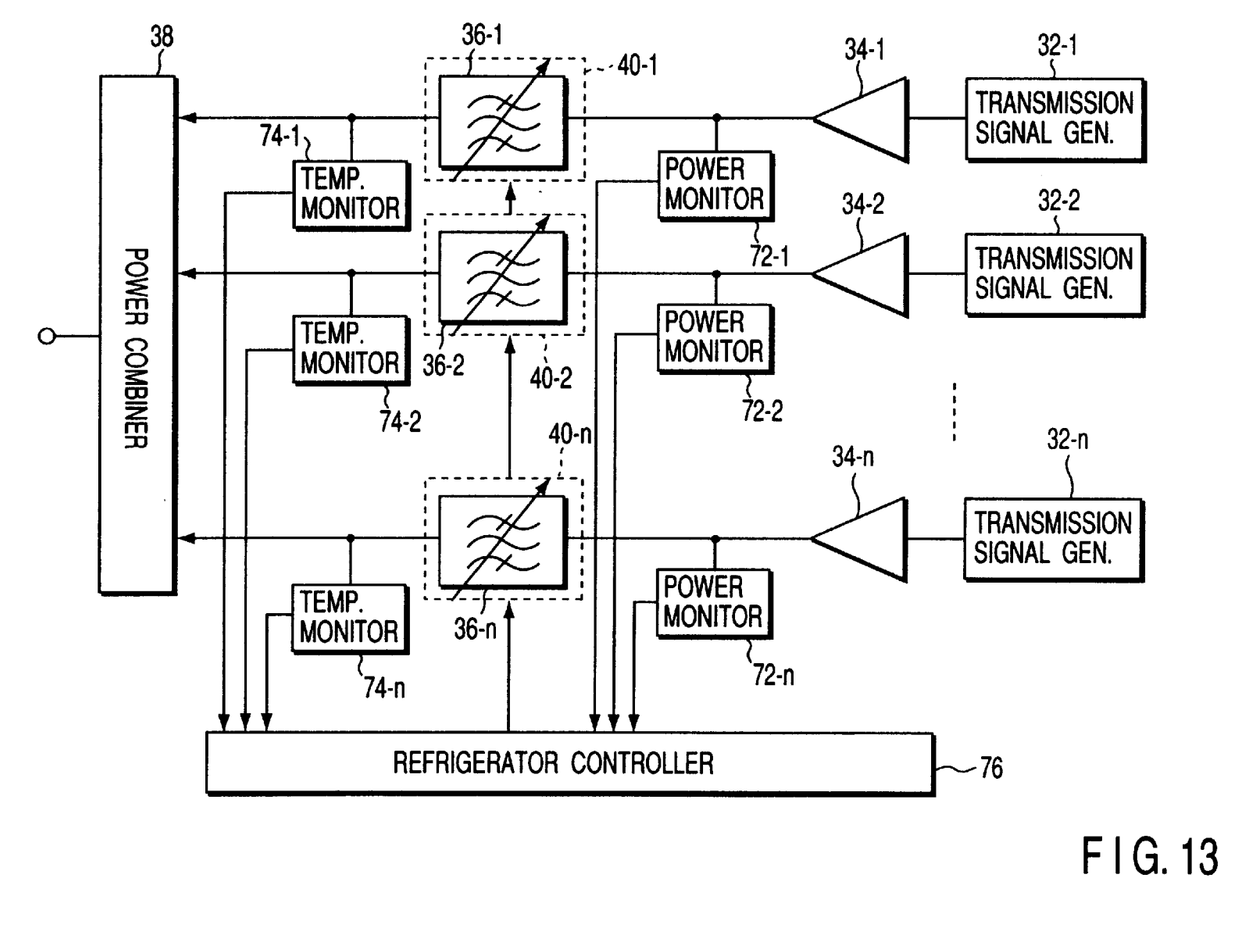
FIG. 13 is a block diagram of a third embodiment of a multicarrier radio transmission apparatus according to the present invention.

FIG. 13 shows the construction of a radio transmission apparatus of the third embodiment. The filter controller 40 for shifting the pass bands of the filters is omitted in the drawing for the sake of simplicity. Power monitors 72-1, 72-2, . . . , 72-n for monitoring powers of signals of individual carrier frequencies are connected to the output terminals of amplifiers 34-1, 34-2, . . . , 34-n and temperature monitors 74-1, 74-2, . . . , 74-n for monitoring the temperatures of filters (superconductive filters) 36-1, 36-2, . . . , 36-n are connected to the output terminals of the filters 36-1, 36-2, . . . , 36-n. Outputs of the power monitors 72-1, 72-2, . . . , 72-n and temperature monitors 74-1, 74-2, . . . , 74-n are supplied to a refrigerator controller 76 to variably control the operation efficiency of refrigerators 40-1, 40-2, . . . , 40-n for cooling the respective filters 36-1, 36-2, . . . , 36-n based on the results of power measurement and temperature measurement.

In FIG. 13, the filter controller 40 for shifting the pass bands of the filters is also omitted for the sake of simplicity.

As described before, the number of carrier frequencies used and the transmission power vary with time and amounts of heat generated in the filters 36-1, 36-2, . . . , 36-n also vary. Therefore, the refrigerators 40-1, 40-2, . . . , 40-n are efficiently operated by varying the abilities of the refrigerators 40-1, 40-2, . . . , 40-n according to the amounts of generated heat of the filters 36-1, 36-2, . . . , 36-n. As a result, power saving can be attained.

A slight time difference due to heat conduction occurs between the temperature measuring timing and the heat generation timing of the filters 36-1, 36-2, . . . , 36-n. Therefore, in a case where the refrigerator is controlled only based on the monitoring results of the power monitors 72-1, 72-2, . . . , 72-n for detecting variations in powers of the amplifiers 34-1, 34-2, . . . , 34-n leading to a fluctuation in the frequency. The constant temperature control operation cannot be attained because of the time difference. Therefore, powers passing through the filters 36-1, 36-2, . . . , 36-n are also measured and the abilities of the refrigerators 40-1, 40-2, . . . , 40-n are varied according to the monitoring result so as to stabilize the frequency.

Fourth Embodiment

Figure 14:
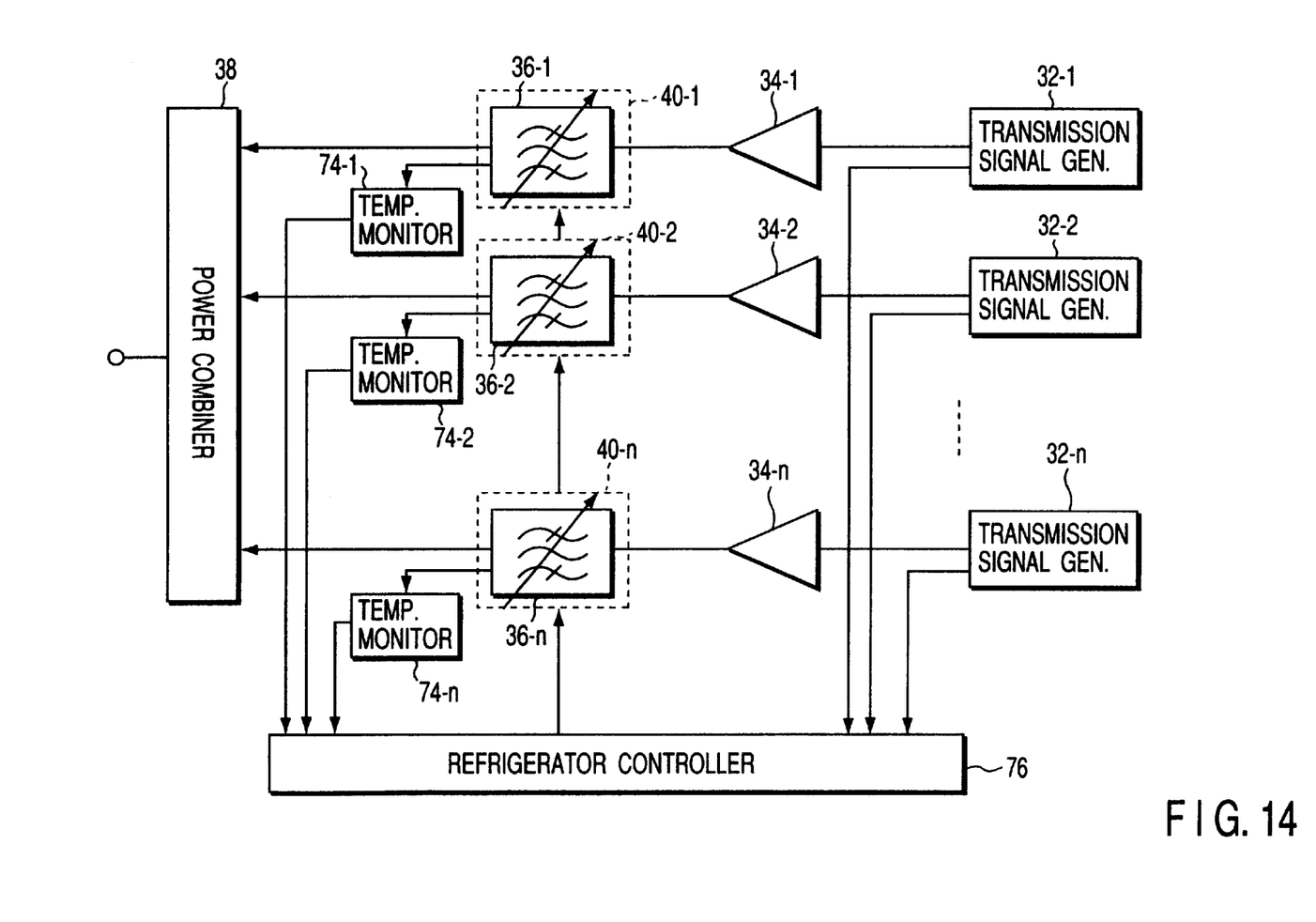
FIG. 14 is a block diagram of a fourth embodiment of a multicarrier radio transmission apparatus according to the present invention.

As shown in FIG. 14, if transmission power is previously known, power monitors 72-1, 72-2, . . . , 72-n for detecting variations in powers of the amplifiers 34-1, 34-2, . . . , 34-n can be omitted and a refrigerator controller 76 may effect the control operation to vary the abilities of the refrigerators 40-1, 40-2, . . . , 40-n based on the output timings of transmission signal generators 32-1, 32-2, . . . , 32-n and the monitoring result of the temperature monitors 74-1, 74-2, . . . , 74-n for monitoring the temperatures of the filters 36-1, 36-2, . . . , 36-n. The filter controller 40 for shifting the pass bands of the filters is also omitted from FIG. 14 for the sake of simplicity.

Fifth Embodiment

Next, a fifth embodiment of a radio transmission apparatus according to the present invention is explained. In the above embodiment, the pass bandwidth of the filter is fixed and only the center frequency is variable to shift the pass band. However, the pass bandwidth of the superconductive filter is variable as explained with reference to FIGS. 5A and 5B and the embodiment in which the pass band can be changed together with the center frequency is explained. Since the circuit diagram is the same as that of each of the first to fourth embodiments, the circuit diagram is not shown in the drawing.

Figure 15:
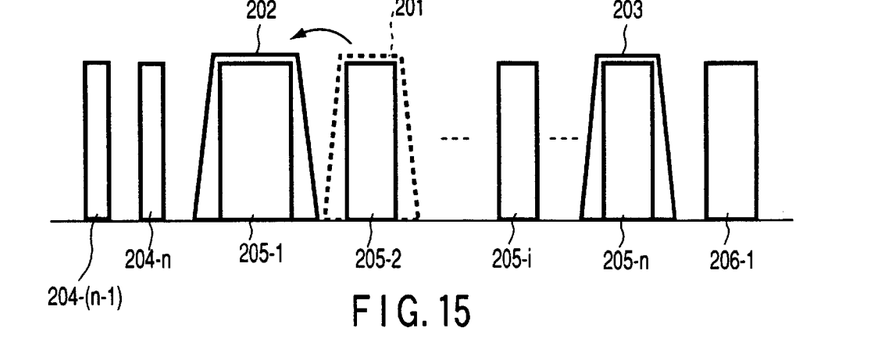
FIG. 15 is a diagram showing the operation for varying the pass band of a filter of a fifth embodiment of a multicarrier radio transmission apparatus according to the present invention.

For example, in a case wherein data of various transmission rates including data of relatively low rate such as a voice and data of relatively high rate such as a moving picture is transmitted, the circuit is constructed to variably control the diffusion bandwidth of individual carriers according to the transmission rate. FIG. 15 shows an example of the changed pass bands of the filters and a state in which the pass band of a filter is changed from a band 201 to a band 202 having a larger bandwidth is shown. A band 203 indicates the pass band of another filter, 205-1, 205-2, . . . , 205-n indicate channels (the bandwidth is variable) assigned to the radio transmission apparatus and 204-1, 204-2, . . . , 204-n; 206-1, 206-2, . . . , 206-n indicate channels assigned to apparatuses other than the above radio transmission apparatus.

According to this embodiment, data transmission from data transmission of relatively low rate as in the case of voice to data transmission of relatively high rate as in the case of moving picture can be coped with.

As described above, according to the present invention, since a signal generated from the transmission signal generator and passing through amplifier and variable band-pass filter corresponding to one channel is only a signal of one carrier frequency, signals of respective carrier frequencies will not cause inter-modulation distortion in the amplifier. Further, since only the signal of one carrier frequency is permitted to pass through the filter, the adjacent channel leakage power is suppressed and inter-modulation distortion of the signal between the channels becomes difficult to occur. Therefore, the individual amplifiers can be operated with high efficiency. Further, since the amplifiers are separately disposed by a number equal to the number of channels, the heat radiation characteristic can be improved and a large-scale heat radiation structure becomes unnecessary.

Further, according to the present invention, interference due to inter-modulation of the signal of another carrier frequency can be prevented by effecting the control operation to select the bands corresponding to the carrier frequencies for the respective channels as the pass bands of the variable band-pass filters provided between the amplifiers and the power combiner. Therefore, it becomes possible to easily combine the signals in power of the respective channels by the combiner and attain power saving of the radio transmission apparatus.

Further, according to the present invention, since a filter having a resistance to withstand the power of a signal of one channel can be used, a superconductive filter can be used as the filter of the radio transmission apparatus.

Also, according to the present invention, data transmission from data transmission with relatively low rate as in the case of voice to high rate data transmission as in the case of moving picture can be coped with by determining the bandwidth of the pass band of each variable band-pass filter according to the signal transmission rate.

Further, according to the present invention, the operation efficiency of the refrigerator for cooling the superconductive filter can be improved to contribute to power saving of the radio transmission apparatus.

This invention is not limited to the above embodiments and can be variously modified without departing from the technical scope thereof.

What is claimed is:

1. A radio transmission apparatus for performing radio transmission by use of carrier frequencies, comprising:

signal processing systems, each including a signal generator configured to generate a signal having one of the carrier frequencies, an amplifier configured to amplify the signal generated from said signal generator, and a variable band-pass filter configured to receive an output signal from said amplifier and to pass the signal of said one of the carrier frequencies;

a filter controller configured to control a pass band of each variable band-pass filter according to each respective signal having one of the carrier frequencies and generated by a respective signal generator;

a combiner configured to combine signals output from said variable band-pass filters of said signal processing systems into a transmission signal;

a fault detector configured to detect a fault of each variable band-pass filter; and a transmission controller configured to stop an operation of a signal processing system having said signal generator, said amplifier, and said variable band-pass filter in which the fault of said variable band-pass filter is detected by said fault detector.

2. The radio transmission apparatus according to claim 1, wherein the filter controller varies a bandwidth of the pass band of each variable band-pass filter according to a transmission rate of the transmission signal.

3. The radio transmission apparatus according to claim 1, wherein each variable band-pass filter comprises a superconductive filter.

4. The radio transmission apparatus according to claim 3, further comprising refrigerators each containing at least one of said superconductive filters.

5. The radio transmission apparatus according to claim 4, further comprising:

a power monitor configured to monitor powers of the signals output from said amplifiers;

a temperature monitor configured to monitor temperatures of said superconductive filters; and a controller configured to control an operation of said refrigerators based on the power monitored by said power monitor and the temperature monitored by said temperature monitor.

6. The radio transmission apparatus according to claim 4, further comprising:

a temperature monitor configured to monitor temperatures of said superconductive filters; and a controller configured to control an operation efficiency of said refrigerators based on a signal output timing of the amplifiers and the temperature monitored by said temperature monitor.

7. The radio transmission apparatus according to claim 1, wherein the filter controller sets a center frequency of the pass band of each variable band-pass filter according to each respective signal having one of the carrier frequencies and generated by a respective signal generator, and sets a fixed bandwidth of the pass band.

8. The radio transmission apparatus according to claim 1, wherein the filter controller sets a center frequency and a bandwidth of the pass band of each variable band-pass filter according to each respective signal having one of the carrier frequencies and generated by a respective signal generator.

9. The radio transmission apparatus according to claim 1, further comprising:

a detector configured to detect a signal generator that does not generate a signal; and an amplifier controller configured to stop operation of an amplifier connected to the signal generator that does not generate the signal.

* * * * *